United States Patent [19]
Shintani

[11] Patent Number: 5,060,046
[45] Date of Patent: Oct. 22, 1991

[54] SEMICONDUCTOR INTEGRATED CIRCUIT DEVICE HAVING ENLARGED CELLS FORMED ON ENDS OF BASIC CELL ARRAYS

[75] Inventor: Yoshio Shintani, Kokubunji, Japan

[73] Assignee: Hitachi, Ltd., Tokyo, Japan

[21] Appl. No.: 658,453

[22] Filed: Feb. 22, 1991

Related U.S. Application Data

[63] Continuation of Ser. No. 457,050, Dec. 26, 1989, abandoned.

[30] Foreign Application Priority Data

Dec. 28, 1988 [JP] Japan ................................ 63-330817

[51] Int. Cl.⁵ ............................................. H01L 27/02
[52] U.S. Cl. ........................................ 357/45; 357/40; 357/42
[58] Field of Search ........................... 357/45, 40, 42

[56] References Cited

U.S. PATENT DOCUMENTS

| | | | |
|---|---|---|---|
| 4,575,745 | 3/1986 | Sharma et al. | 357/42 |
| 4,692,783 | 9/1987 | Monma et al. | 357/45 |
| 4,851,891 | 7/1989 | Kubasawa et al. | 357/42 |
| 4,904,886 | 2/1990 | Tanahashi | 357/45 |
| 4,920,398 | 4/1990 | Yoshio et al. | 357/42 |

FOREIGN PATENT DOCUMENTS

| | | |
|---|---|---|
| 58-190036 | 11/1983 | Japan . |
| 62-150844 | 7/1987 | Japan . |
| 63-226942 | 9/1988 | Japan ................................ 357/45 |
| 63-29639 | 12/1988 | Japan ................................ 357/45 |

Primary Examiner—J. Carroll
Attorney, Agent, or Firm—Pennie & Edmonds

[57] ABSTRACT

In a semiconductor integrated circuit device of master slice scheme having an internal circuit region and peripheral circuits which surround the internal circuit region, the internal circuit region including wiring channel regions and basic cell arrays in each of which a plurality of basic cells are arranged in a matrix shape. Special basic cells constructed of transistors which are larger in size than transistors constituting the basic cells are disposed at the end parts of each of the basic cell arrays, and a circuit of high driving power is manufactured using one or more of the special basic cells. In addition, those parts of an insulator film on the special basic cells which extend beyond the width lines of the basic cell array are used for the wiring channel regions. Thus, the utilization factor of the basic cells can be enhanced more than in a case where the circuit of high driving power is formed by connecting some of the basic cells in parallel, and the circuit of high driving power can be formed without lowering the utilization factor of the wiring channel regions.

16 Claims, 16 Drawing Sheets

SEMICONDUCTOR INTEGRATED CIRCUIT DEVICE HAVING ENLARGED CELLS FORMED ON ENDS OF BASIC CELL ARRAYS

This is a continuation of application Ser. No. 07/457,050, filed Dec. 26, 1989, now abandoned.

BACKGROUND OF THE INVENTION

The present invention relates to a semiconductor integrated circuit device, and more particularly to techniques which are effective when applied to the cell layout of a logic LSI that is fabricated in accordance with a master slice scheme.

A gate array being a typical example of a logic LSI which is fabricated in accordance with the master slice scheme, usually has a cell layout wherein basic cells are arranged in a matrix array inside peripheral circuits which function as interfaces with the exterior. Various logic circuits, such as inverters, AND (NAND) gates, OR (NOR) gates and flip-flops, are formed by properly combining and connecting the basic cells. That is, the gate array permits the required logic circuits to be formed by altering the patterns of wiring on a master wafer and therefore permits many kinds of products to be developed in a short period of time. Besides, the aforementioned logic circuits include also circuits, for example, a clock buffer circuit and a delay circuit, each of which requires a driving power level higher than that of the general logic circuit. In case of forming such a circuit, the high driving power is secured ordinarily by connecting some of the basic cells in parallel.

SUMMARY OF THE INVENTION

Techniques for improving the gate array having the cell layout as stated above are disclosed in the official gazettes of Japanese Patent Application Laid-open No. 190036/1983 and Japanese Patent Application Laid-open No. 150844/1987 for instance.

FIG. 1 is a plan view of a semiconductor chip 30 showing the cell layout organization of the latter (the official gazette of Japanese Patent Application Laid-open No. 150844/1987). With this technique, among basic cell arrays 32 disposed inside peripheral circuits 31, the middle arrays 32a in one row (arrays hatched in the figure), for example, are constructed of transistors larger in size (gate width) than transistors constituting the other basic cell arrays 32, and the circuit of high driving power, such as clock buffer circuit, is formed using the special basic cells 32a.

On the other hand, FIG. 2 is a plan view of a semiconductor chip 30 showing the cell layout organization of the former (the official gazette of Japanese Patent Application Laid-open No. 190036/1983). With this technique, general-purpose cell arrays 33 are interposed adjoining peripheral circuits 31 between the peripheral circuits 31 and basic cell arrays 32 disposed inside them, and output buffer circuits are formed using parts of the general-purpose cell arrays 33 (parts indicated by marks "x" in the figure), while testing circuits and/or any other desired circuits (for example, the clock buffer circuit and a Schmitt trigger circuit) are formed using the other parts of the general-purpose cell arrays 33 (parts indicated by hatching in the figure).

The inventor's study has revealed that the cell layout organizations mentioned above have problems as explained below:

In the cell layout organization disclosed in the official gazette of Japanese Patent Application Laid-open No. 150844/1987 wherein the specified arrays of one row among the basic cell arrays are constructed of the transistors which are larger in size than the transistors constituting the other basic cell arrays, when design automation or automatic placement and routing based on the master slice scheme is performed, wiring lines for connecting the peripheral input buffer circuit and the clock buffer circuit formed of the special basic cells become long in some cases. This leads to the problem that the impedances of the wiring lines increase to render the level of an input signal unstable, so the clock buffer circuit cannot satisfactorily demonstrate its function. Another problem is that, since the special basic cell arrays are constructed of the transistors of larger size, the effective utilization of wiring channel regions is hindered accordingly, so the versatility of wiring design degrades.

Moreover, since the cells whose transistors are larger in size than the transistors constituting the other basic cells are provided, the wiring channel regions diminish to that extent with the identical chip size, and hence, the versatility of the wiring design degrades.

On the other hand, in the cell layout organization disclosed in the official gazette of Japanese Patent Application Laid-open No. 190036/1983 wherein parts of the general-purpose cell arrays arranged adjoining the peripheral circuits are used for forming the output buffer circuits, while the remaining parts are used for forming the testing circuits and/or any other desired circuits; the characteristics of the circuits which are formed of the general-purpose cell arrays and those of the circuits which are formed of the basic cell arrays need to be brought into agreement in relation to logic design. That is, the size of each transistor constituting the general-purpose cell array needs to be equalized to that of each transistor constituting the basic cell array. In forming the circuit of high driving power by the use of such a general-purpose cell array, therefore, the high driving power must be secured by connecting some of general-purpose cells in parallel. This poses the problem that the effective utilization of the general-purpose cells is hampered.

Moreover, since the general-purpose cell arrays are disposed, the chip size enlarges to that extent.

The present invention has been made in view of the problems of the foregoing techniques, and has for its object to provide a technique which can enhance the operating reliability of a semiconductor integrated circuit device that is fabricated in conformity with the master slice scheme.

Another object of the present invention is to provide a technique which can achieve the aforementioned object and by which, in the semiconductor integrated circuit device that is fabricated in conformity with the master slice scheme, a circuit requiring a driving power level higher than that of a general logic circuit can be formed without lowering the utilization efficiencies of basic cells and wiring channel regions.

The above and other objects and novel features of the present invention will become apparent from the description of this specification when read in conjunction with the accompanying drawings.

Typical aspects of performance of the present invention are briefly summarized as follows:

One aspect of performance of the present invention consists, in a semiconductor integrated circuit device of master slice scheme wherein an internal circuit region is surrounded with peripheral circuits, the internal circuit region including wiring channel regions and basic cell arrays in each of which a plurality of basic cells are arranged in a matrix shape, in that special basic cells constructed of transistors which are larger in size than transistors constituting other basic cells of said each basic cell array are disposed at end parts of said each basic cell array.

Another aspect of performance of the present invention consists in that those parts of said each special basic cell which extend beyond width lines of said each basic cell array are buried under said wiring channel regions.

According to the first aspect of performance, a circuit, for example, clock buffer circuit, which requires a driving power level higher than that of a general logic circuit can be disposed at the end part of the basic cell array, so that wiring lines for connecting the peripheral input buffer circuit and the clock buffer circuit can be shortened in case of design automation or automatic placement and routing based on the master slice scheme. Thus, the impedances of the wiring lines lower to stabilize an input signal level, so that the operating reliability of circuitry is enhanced. Moreover, the circuit of higher driving power is formed using the special basic cell, whereby the utilization factor of the basic cells is enhanced more than in the case where the circuit of higher driving power is formed by connecting some of the basic cells in parallel.

According to the second aspect of performance, those parts of the special basic cell which extend beyond the width lines of the basic cell array are buried under the wiring channel regions, whereby the circuit of higher driving power can be formed without lowering the utilization factor of the wiring channel regions and without enhancing the chip size.

The construction of the present invention will be described below in conjunction with embodiments in which the present invention is applied to a semiconductor integrated circuit device adopting a complementary MOS (Metal-Oxide-Semiconductor) gate array.

Throughout the drawings for describing the embodiments, the same symbols shall be assigned to portions having identical functions and shall not be repeatedly explained.

DESCRIPTION OF THE PREFERRED EMBODIMENTS

Embodiment 1

Figure 1:
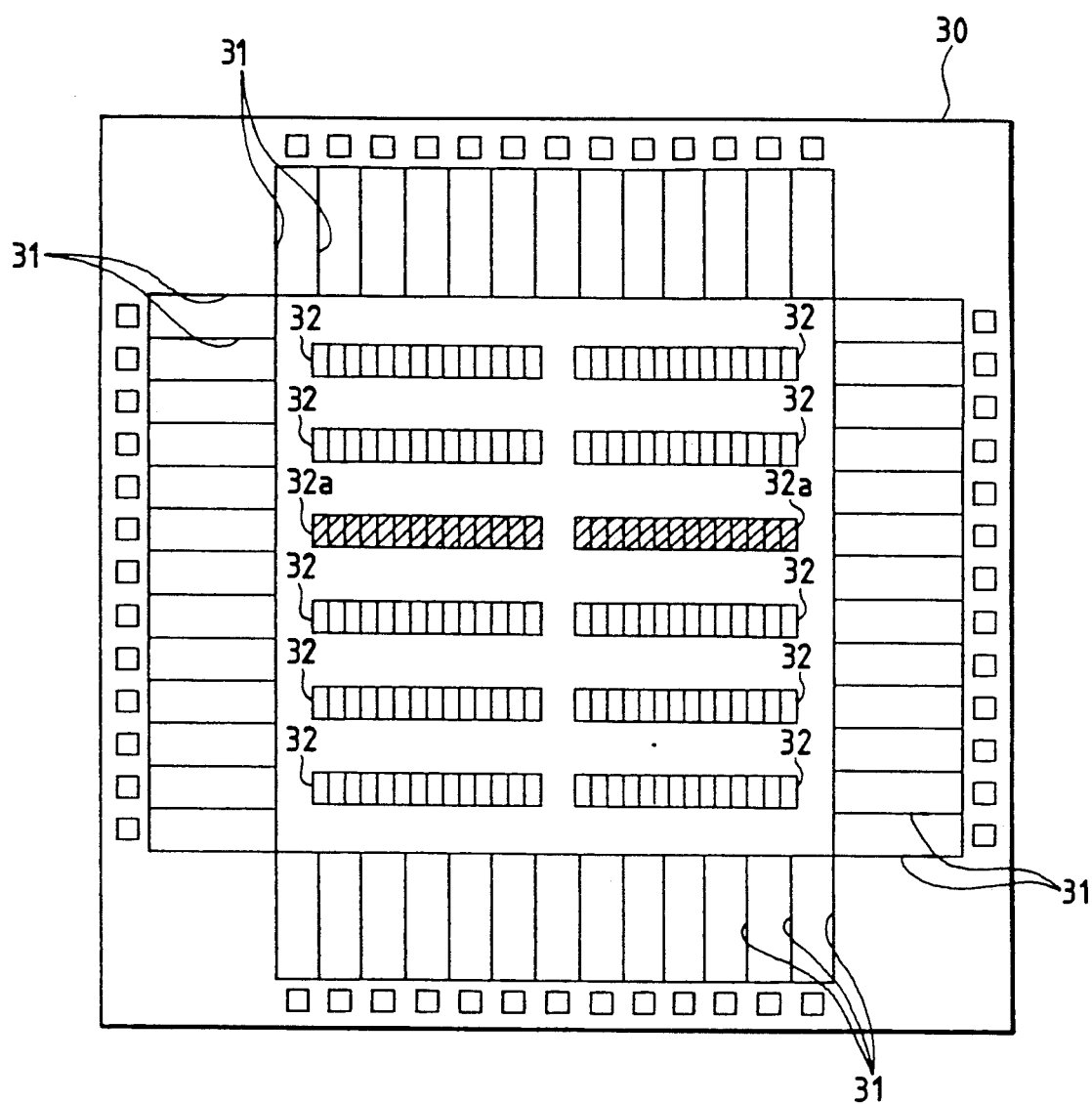
FIGS. 1 and 2 are plan views each showing a prior-art cell layout.
Figure 2:
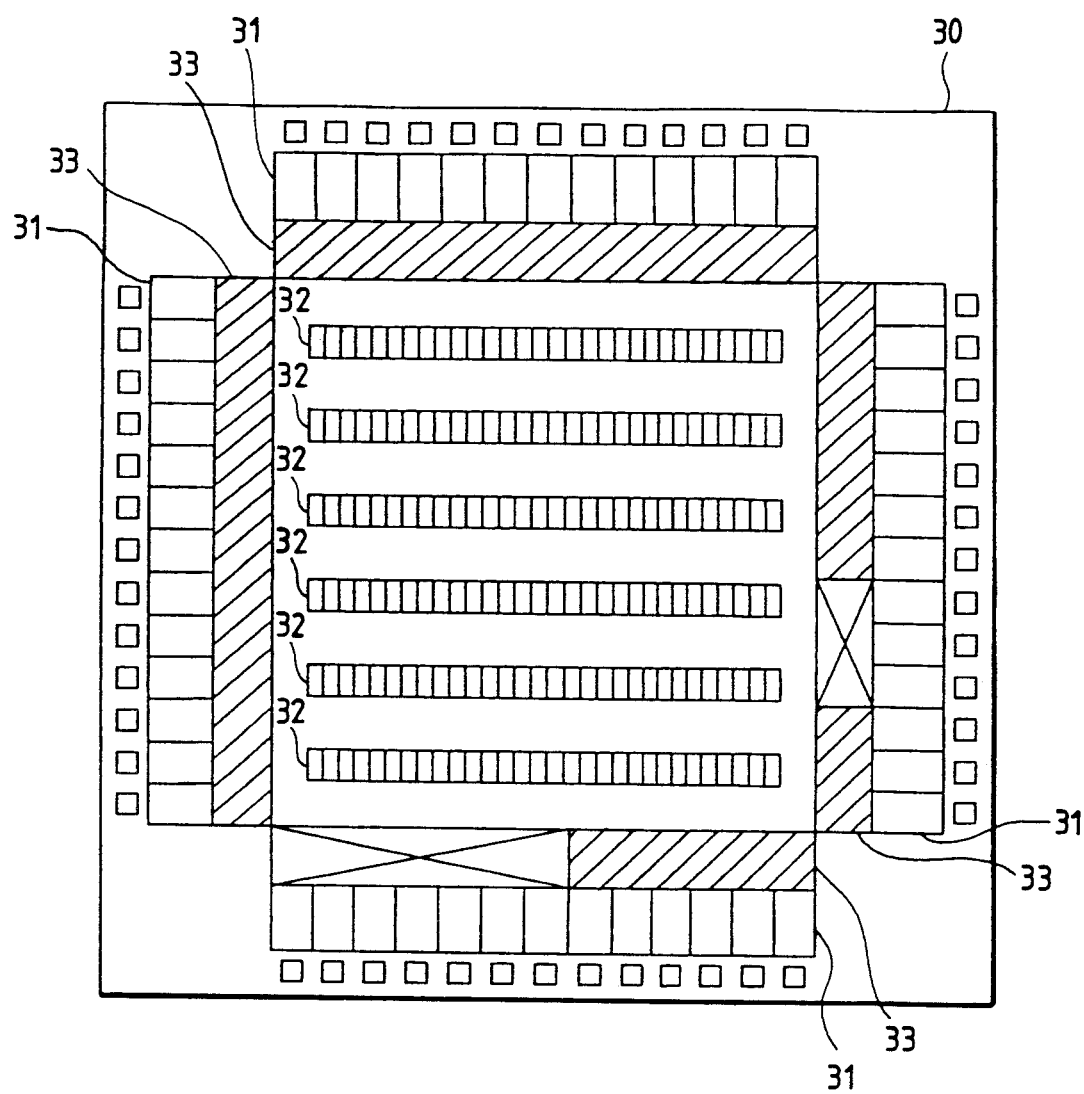
Figure 3:
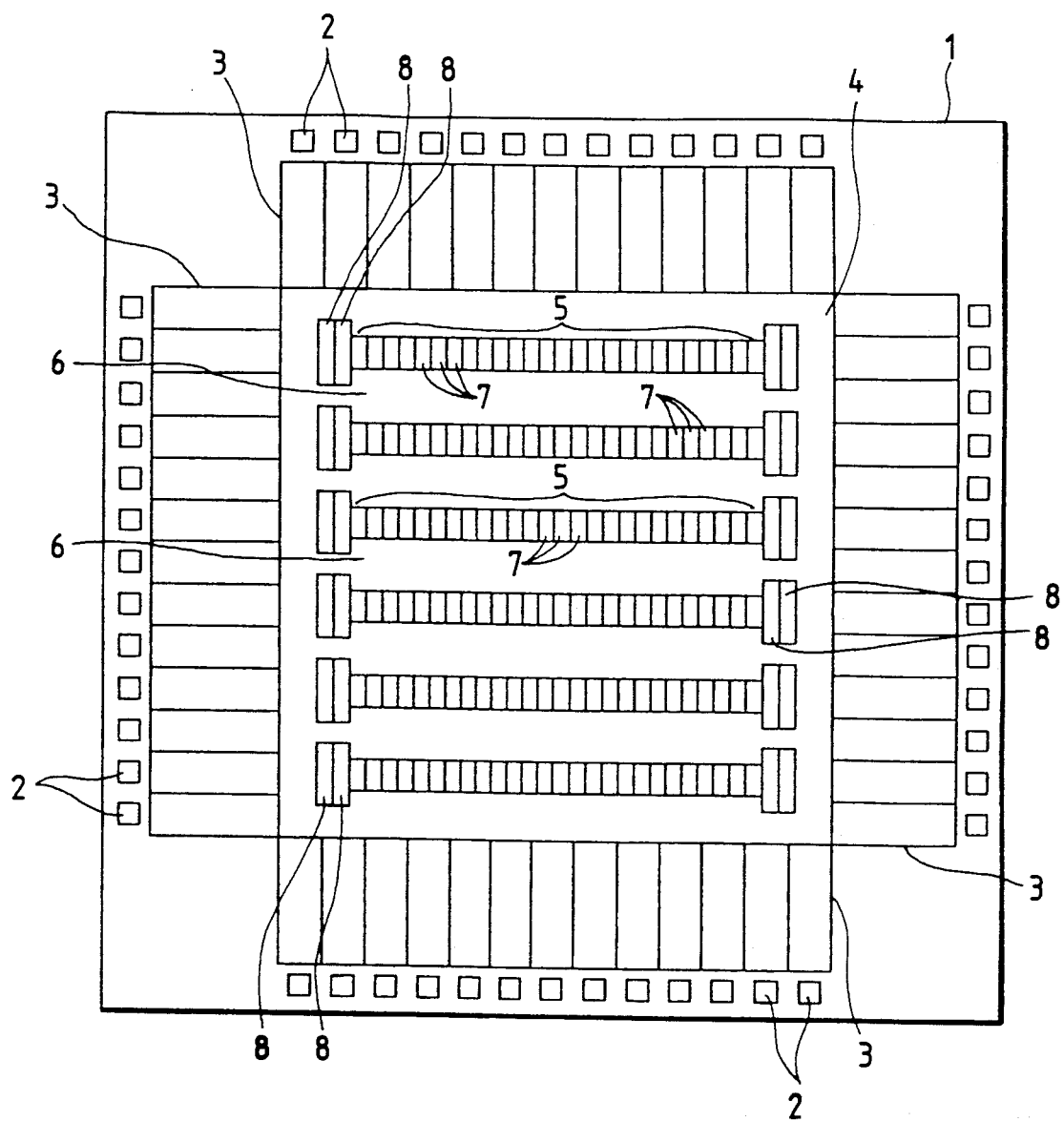
FIG. 3 is a plan view showing the cell layout of a semiconductor integrated circuit device which is an embodiment of the present invention.

FIG. 3 (a plan view) shows the fundamental schematic construction of a semiconductor integrated circuit device adopting a complementary MOS gate array, which is an embodiment of the present invention.

As shown in FIG. 3, the semiconductor integrated circuit device of this embodiment is constructed of a semiconductor chip 1 (for example, single-crystal silicon substrate) which is square in plan.

The semiconductor integrated circuit device of this embodiment is constructed of a two-layer wiring structure. Accordingly, external terminals (bonding pads) 2 are formed on the upper one of wiring layers and by the manufacturing step of forming the second (and first) wiring layer. Each wiring layer of the two-layer wiring structure is made of aluminum wiring lines or aluminum alloy wiring lines. The aluminum alloy wiring lines are such that Al (aluminum) is doped with Cu (copper) or with Cu and Si (silicon). The dopant Cu chiefly functions to mitigate the influence of electromigration. On the other hand, the dopant Si chiefly functions to mitigate the phenomenon of alloy spikes.

By way of example, the semiconductor chip 1 is made of the single-crystal silicon substrate of the n-type having a resistivity of 3-6 ($\chi$-cm).

On the principal surface of the semiconductor chip 1, the bonding pads 2 are provided along each of the peripheral edge parts of this chip 1, and a plurality of I/O (input/output) cells 3 for forming, for example, input/output buffer circuits and pre-buffer circuits are provided inside the bonding pads 2. Each of the input/output buffer circuits and the pre-buffer circuits is formed by combining a predetermined number of complementary MOSFETs (Metal-Oxide-Semiconductor Field-Effect Transistors) which constitute the I/O cell 3.

An internal circuit region 4 which is surrounded with the I/O cells 3 is provided with a large number of basic cell arrays 5 each of which extends in a column direction. These basic cell arrays 5 are disposed at predetermined intervals in a row direction, and the remaining part of the internal circuit region 4 except the basic cell arrays 5 (and special basic cells 8 to be described later) forms wiring channel regions 6.

Each of the basic cell arrays 5 is configured of a large number of basic cells 7 which are joined in the column direction, and each of which is constructed of a predetermined number of complementary MOSFETs. The complementary MOSFETs constituting the basic cells 7 are made of small-sized transistors so that a large number of logic circuits can be formed. On the other hand, the complementary MOSFETs constituting the I/O cells 3 (the input/output buffer circuits and the pre-buffer circuits) are made of transistors which are larger in size than the complementary MOSFETs constituting the basic cells 7, for the reason that they need to amplify a signal from a logic circuit of low driving ability and then supply an external circuit with the amplified signal and to supply a large number of logic circuits with a signal from an external circuit.

Figure 4:
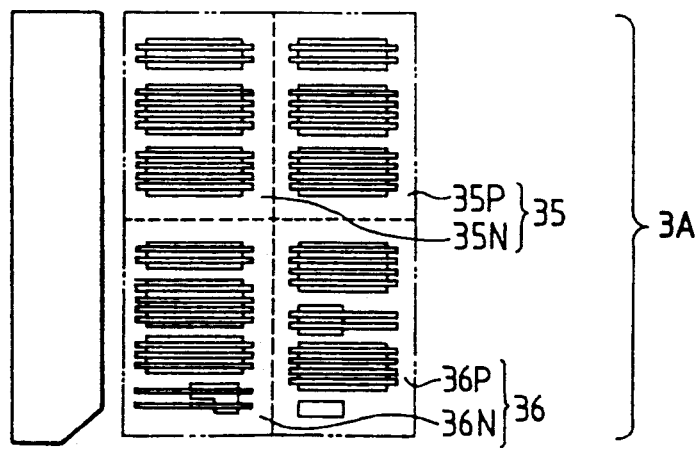
FIG. 4 is a pattern layout diagram of I/0 cells.
Figure 4:
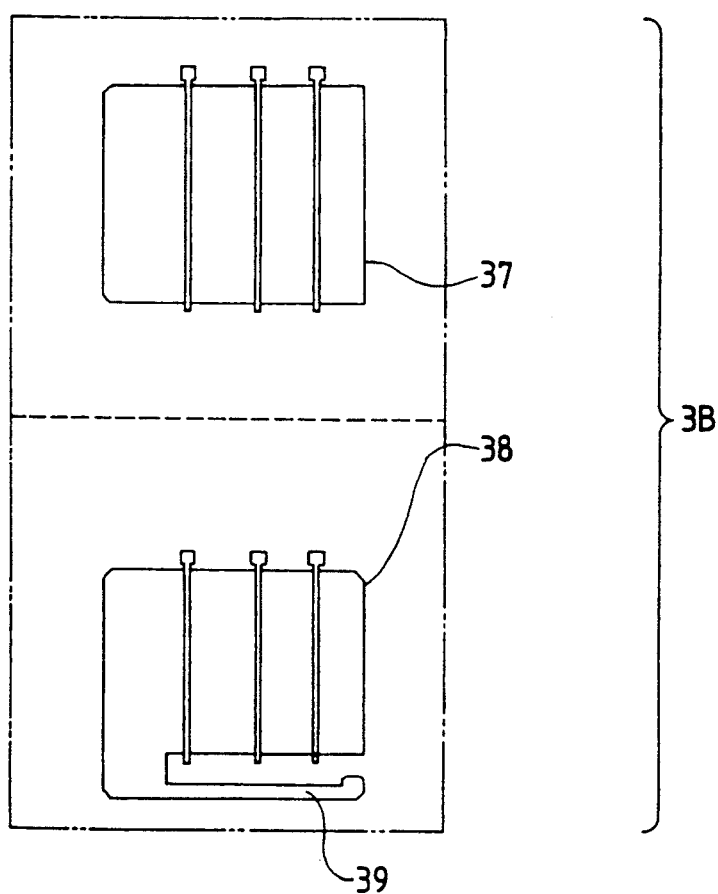
Figure 4:
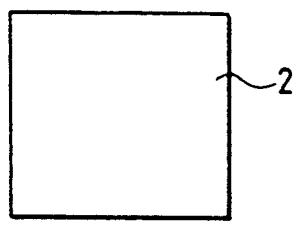

As shown in FIG. 4, each of the I/O cells 3 is mainly configured of complementary MOSFETs for an input circuit which are arranged in the first cell forming region 3A, and complementary MOSFETs for an output circuit which are arranged in the second cell forming region 3B and which are higher in the driving ability (in other words, greater in the gate width/gate length ratio) than the input-circuit complementary MOSFETs. The input-circuit complementary MOSFETs include complementary MOSFETs 35 for the pre-buffer circuit, and complementary MOSFETs 36 for the input circuit. The complementary MOSFETs 35 for the pre-buffer circuit consist of N-channel MOSFETs 35N and P-channel MOSFETs 35P. Similarly, the complementary MOSFETs 36 for the input circuit consist of N-channel MOSFETs 36N and P-channel MOSFETs 36P.

The output-circuit complementary MOSFETs and a protective resistor 39 are formed in the second cell forming region 3B. The output-circuit complementary MOSFETs consist of N-channel MOSFETs 37 and P-channel MOSFETs 38.

Incidentally, the construction of such an I/O cell 3 is stated in, for example, U.S. Ser. No. 367,324 filed on June 16. 1989.

Figure 5:
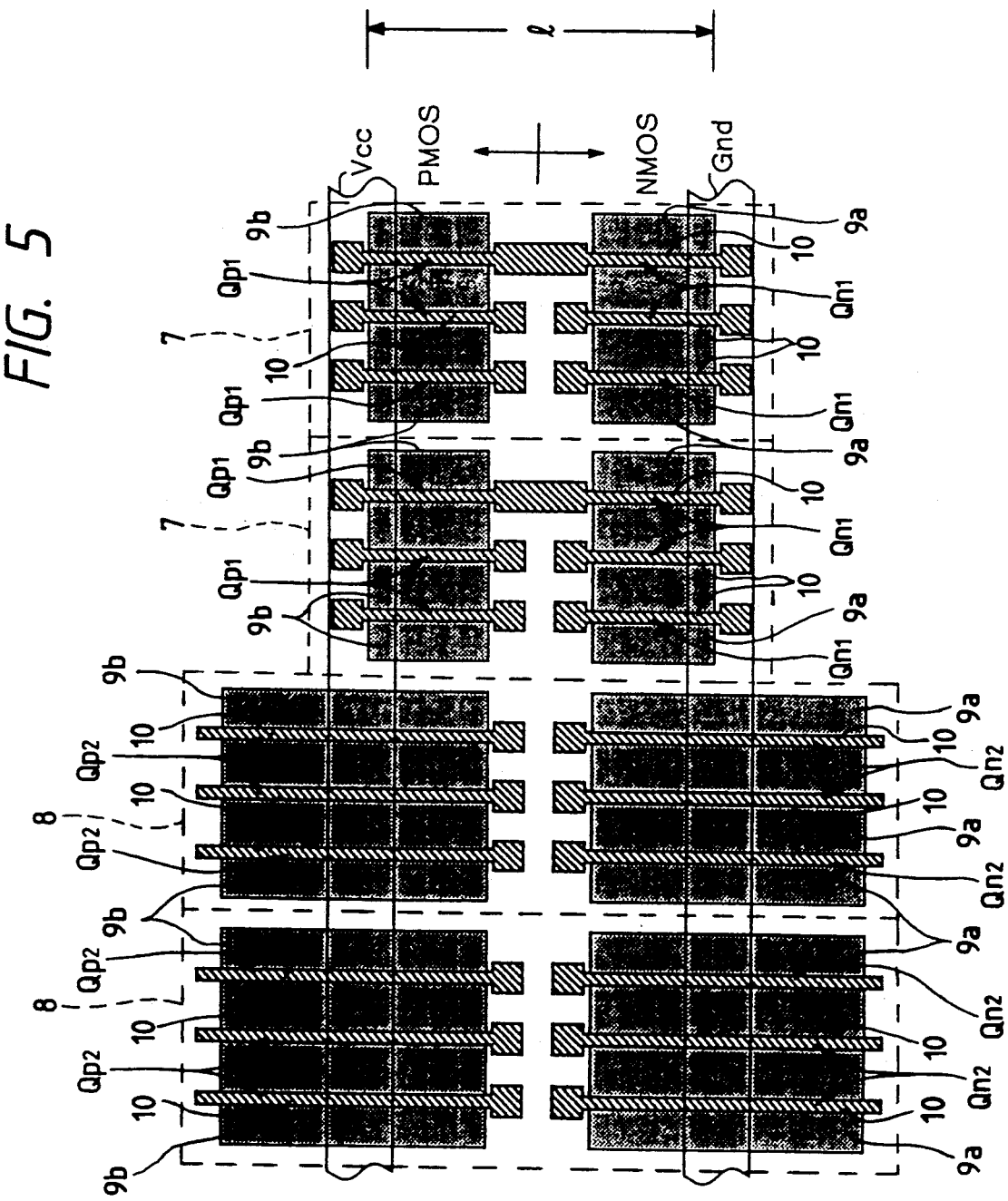
FIG. 5 is a pattern layout diagram of special basic cells.

The special basic cells 8 are provided at each end of the basic cell array 5 as seen from FIG. 3. As shown in FIG. 5, each of the special basic cells 8 is constructed of three complementary pairs of MOSFETs. That is, each special basic cell 8 is constructed of three P-channel MOSFETs $Q_{p2}$ and three N-channel MOSFETs $Q_{n2}$. Likewise, each of the basic cells 7 is constructed of three complementary pairs of MOSFETs. That is, each basic cell 7 is constructed of three P-channel MOSFETs $Q_{p1}$ and three N-channel MOSFETs $Q_{n1}$.

Figure 6:
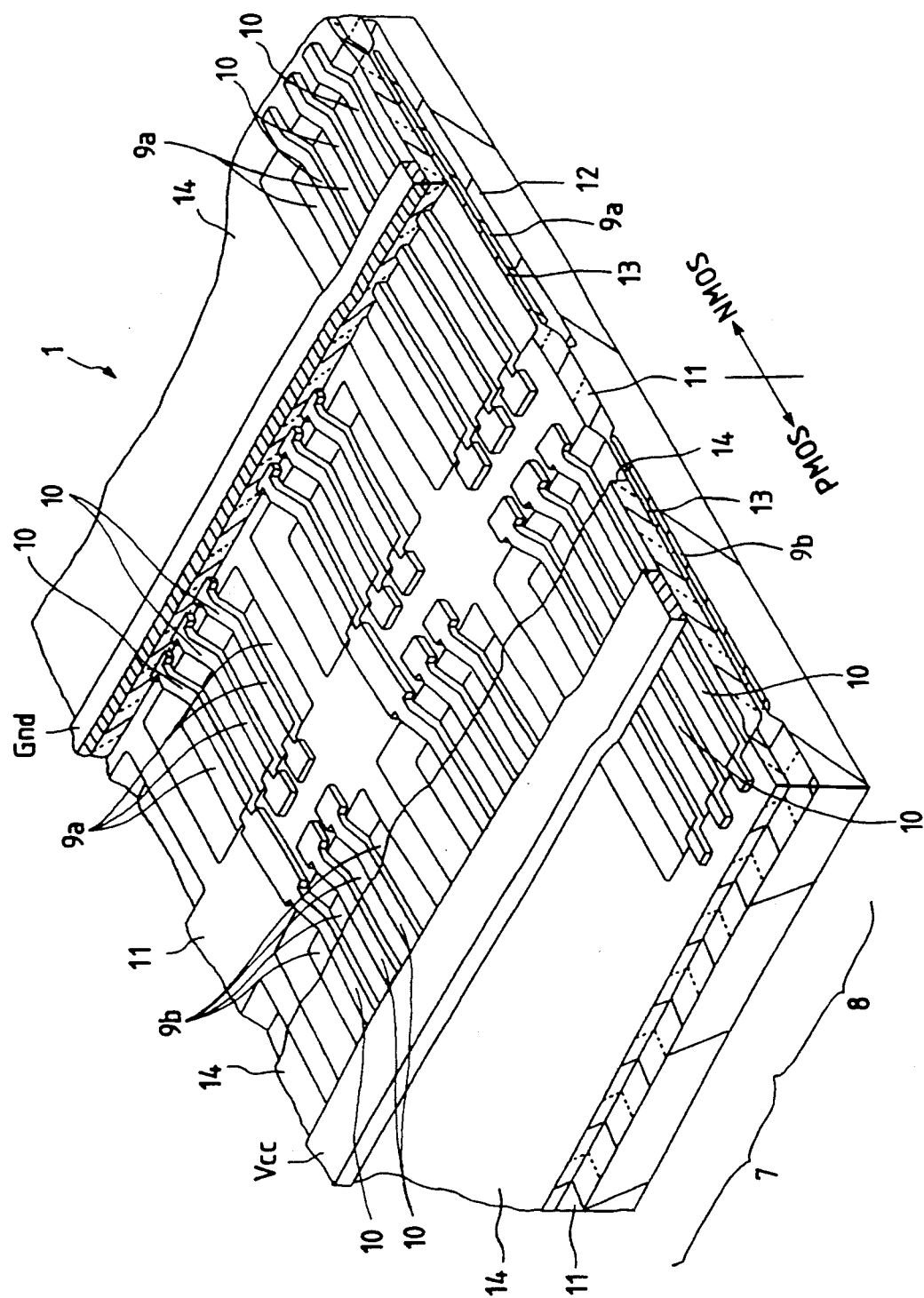
FIG. 6 is a perspective view, partly in section, showing the sectional structure of a semiconductor chip near the end of a basic cell array.

As shown in FIG. 6, the Pchannel MOSFETs $Q_{p1}$ and $Q_{p2}$ are formed on the principal surface of the semiconductor chip 1 within a region whose perimeter is defined by a field insulator fill 11. Each of the P-channel MOSFETs $Q_{p1}$ and $Q_{p2}$ is mainly constructed of a gate oxide film, a gate electrode 10, and a pair of $p^+$-type semiconductor regions 9b respectively forming a source region and a drain region. The N-channel MOSFETs $Q_{n1}$ and $Q_{n2}$ are formed on the principal surface of a p-type well region 12 within a region whose perimeter is defined by the field insulator film 11. Each of the N-channel MOSFETs $Q_{n1}$ and $Q_{n2}$ is mainly constructed of a gate oxide film, a gate electrode 10, and a pair of $n^+$-type semiconductor regions 9a respectively forming a source region and a drain region.

One $p^+$-type semiconductor region 9b of the P-channel MOSFET $Q_{p1}$ and $Q_{p2}$ is formed unitary with the other $p^+$-type semiconductor region 9b of the different P-channel MOSFET $Q_{p1}$ or $Q_{p2}$ adjoining the former P-channel MOSFET in a gate length direction. That is, the adjacent ones of the three P-channel MOSFETs $Q_{p1}$ or $Q_{p2}$ are connected in series without the intervention of the field insulator film 11. Likewise, one $n^+$-type semiconductor region 9a of the N-channel MOSFET $Q_{n1}$ or $Q_{n2}$ is formed unitary with the other $n^+$-type semiconductor region 9a of the different N-channel MOSFET $Q_{n1}$ or $Q_{n2}$ adjoining the former N-channel MOSFET in the gate length direction. That is, the adjacent ones of the three N-channel MOSFETs $Q_{n1}$ or $Q_{n2}$ are connected in series. Here, the basic cell 7 is constructed so as to easily form a 3-input NAND gate circuit. However, the basic cell 7 is not restricted to the 3-input NAND gate circuit, but it may well be constructed so as to easily form a 2-input NAND gate circuit or a 4-input NAND gate circuit.

The elements included in the basic cell 7 are mainly connected by the wiring lines which are laid by the step of forming the first layer of wiring. The basic ell 7 subjected to the connection constructs a predetermined logic circuit such as the NAND gate circuit or an F/F (flip-flop) circuit, or part of the logic circuit.

By way of example, the gate electrode 10 can be formed of a polycrystalline silicon film into which an impurity is introduced in order to lower the resistance thereof, or a composite film in which the polycrystalline silicon film is overlaid with a film of refractory metal silicide (such as $WSi_2$ or $MoSi_2$). The field insulator film 11 can be formed of a silicon oxide film which is produced in such a way that the principal surface of the semiconductor chip 1 is oxidized by local oxidation.

An inter-layer insulator film 14 is formed on the principal surface of the semiconductor chip 1 including the upper surfaces of the gate electrodes 10. In FIG. 6, the inter-layer insulator film 14 is partly omitted. This inter-layer insulator film 14 is made of, for example, PSG (Phospho-Silicate Glass) or BPSG (Boron-doped Phospho-Silicate Glass) so that its upper surface can be flattened.

As seen from FIGS. 5 and 6, the MOSFETs $Q_{p2}$ and $Q_{n2}$ constituting the special basic cell 8 are larger in size than the MOSFETs $Q_{p1}$ and $Q_{n1}$ constituting the basic cell 7. When compared with those of the MOSFETs $Q_{p1}$ and $Q_{n1}$ of the basic cell 7, the source/drain semiconductor regions 9a and 9b and the gate electrodes 10 of the MOSFETs $Q_{p2}$ and $Q_{n2}$ of the special basic cell 8 are made longer in the row direction as viewed in FIG. 5. Thus, the MOSFETs $Q_{p2}$ and $Q_{n2}$ of the special basic cell 8 have a gate width greater than that of the MOSFETs $Q_{p1}$ and $Q_{n1}$ of the basic cell 7 and can therefore form a circuit of higher driving power level.

On the principal surface of the semiconductor chip 1 constructed as described above, the patterns of predetermined wiring are formed according tot he master slice scheme, whereby desired logic circuits are manufactured.

At that time, the logic circuit of low driving ability, such as an inverter, AND (or NAND) gate, OR (or NOR) gate or flip-flop, is manufactured by properly combining the basic cells 7 in a predetermined number. On the other hand, the logic circuit requiring a high driving ability, such as the clock buffer circuit, buffer circuit between blocks, or delay circuit, is manufactured using the special basic cells 8.

Meanwhile, wiring lines for power source voltages ($V_{cc}$ and Gnd) and internal wiring lines for connecting the MOSFETs within the basic cells 7 as well as the special basic cells 8 are formed on the inter-layer insulator film 14 by the step of forming the first wiring layer.

The internal wiring lines for connecting the basic cells 7 and the special basic cells 8 are all patterned and formed within the width (l) of the basic cell array 5. The upper surface of the inter-layer insulator film 14 on those parts of the special basic cells 8 which extend beyond the width (l) of the basic cell array 5 is used as the wiring channel regions 6.

The power source voltage wiring lines and the internal wiring lines laid by the step of forming the first wiring layer are electrically connected with the basic cells 7 and the special basic cells 8 through contact holes 17 to be described later.

The basic cells 7, the logic circuits constituted by the basic cells 7, the special basic cells 8, and the logic circuits constituted by the special basic cells 8 are interconnected by signal wiring lines which are laid by the steps of forming the first and second wiring layers.

The signal wiring lines which are laid by the step of forming the first wiring layer, are mainly placed on the wiring channel regions 6 and extended in the column direction. The signal wiring lines which are laid by the step of forming the second wiring layer, are mainly extended in the row direction.

The signal wiring lines and the internal wiring lines laid by the step of forming the first wiring layer are electrically insulated from the signal wiring lines laid by the step of forming the second wiring layer by an inter-layer insulator film formed between both the wiring layers, and are electrically connected therewith through contact holes 19 to be described later.

Figure 7:
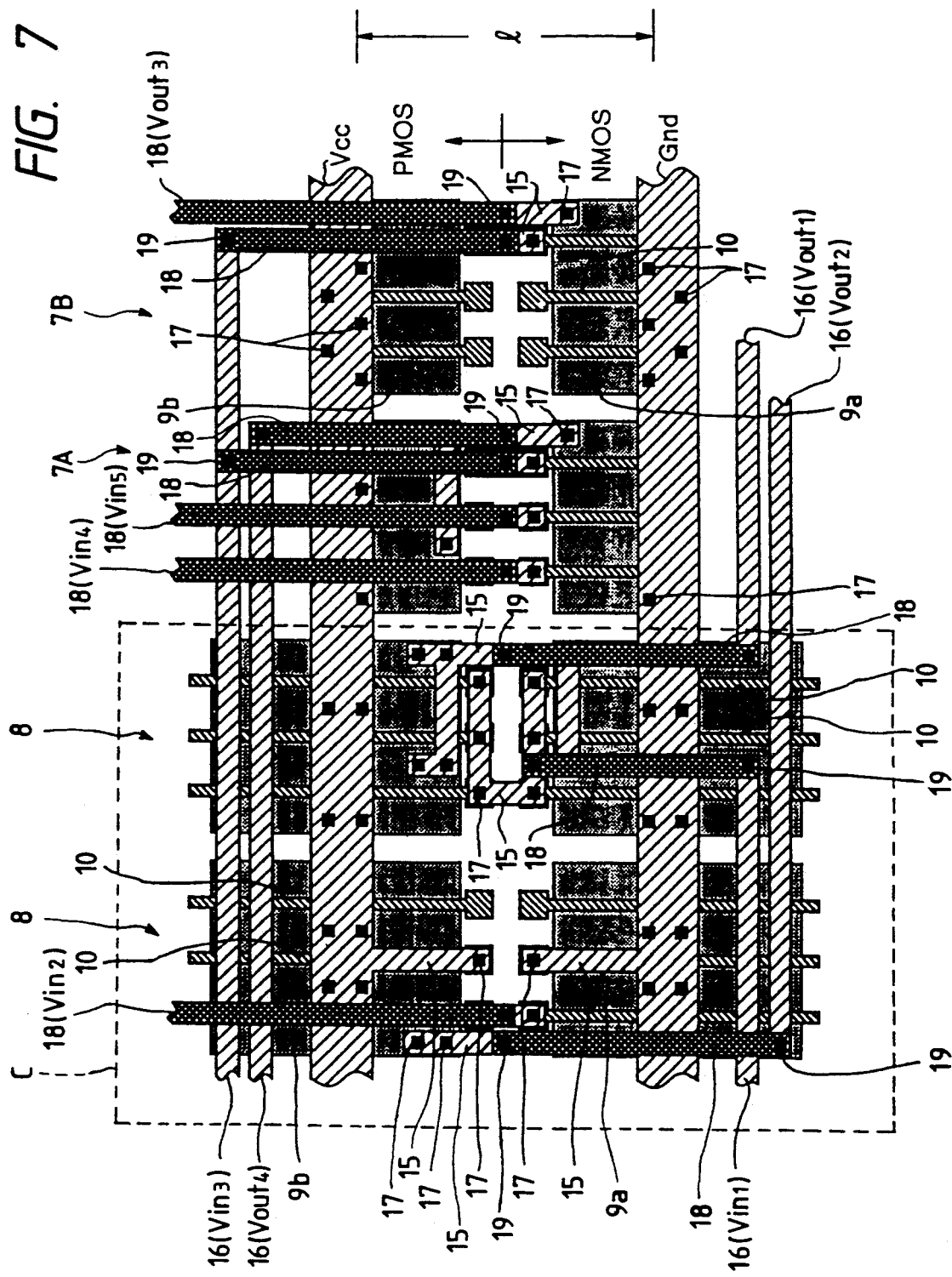
FIG. 7 is a block circuit diagram showing a clock buffer circuit which is formed using the special basic cells.
Figure 8:
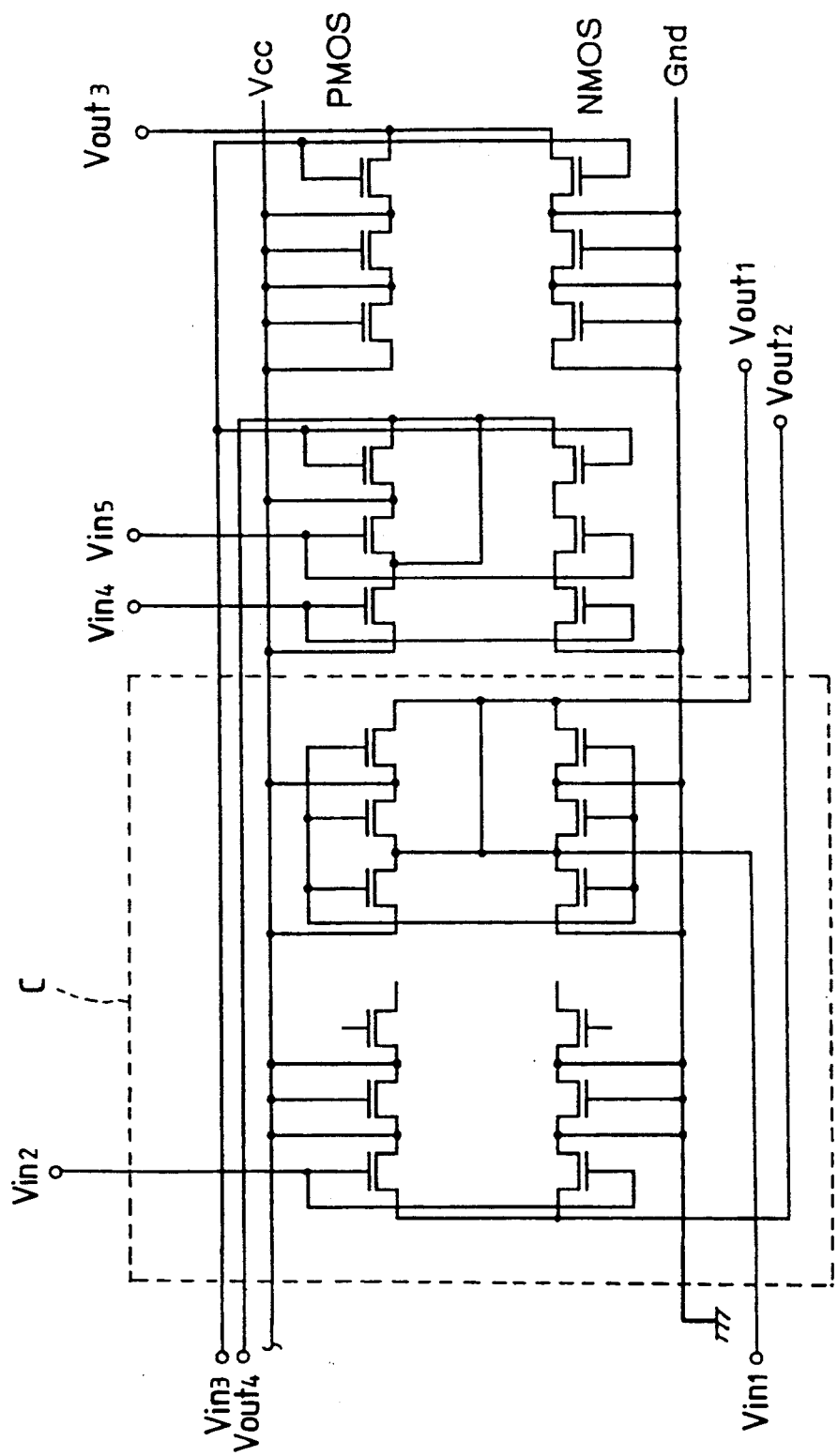
FIG. 8 is an equivalent circuit diagram corresponding to FIG. 7.

FIG. 7 (a block circuit diagram) and FIG. 8 (an equivalent circuit diagram corresponding to FIG. 7) illustrate a clock buffer circuit C which is manufactured using two of the special basic cells 8. Referring to FIG. 7, numeral 15 designates the internal wiring lines (of the first layer) which interconnect the transistors within the special basic cells 8 (the basic cells 7), and numeral 16 designates the signal wiring lines (of the first layer). The internal wiring lines 15 are electrically connected with the semiconductor regions 9a, 9b and the gate electrodes 10 through the contact holes 17, respectively. These internal wiring lines 15 are all patterned and laid within the width (l) of the basic cell array 5. Accordingly, those parts of the special basic cells 8 which extend beyond the width (l) of the basic cell array 5 are buried under the inter-layer insulator film 14, and the corresponding upper parts of the inter-layer insulator film 14 are used as the wiring channel regions 6.

The signal wiring lines 18 of the second layer are patterned and laid over the power source voltage wiring lines ($V_{cc}$ and Gnd), internal wiring lines 15 and signal wiring lines 16 through the inter-layer insulator film not shown. These signal wiring lines 18 are electrically connected with the internal wiring lines 15 and the signal wiring lines 16 through the contact holes 19, respectively.

By way of example, a clock signal is input from the bonding pad 2 to the clock buffer circuit C via the I/O cell 3.

According to the complementary MOS gate array of Embodiment 1 constructed as described above, the following effects can be attained:

(1) Special basic cells 8 which are constructed of transistors larger in size than transistors constituting basic cells 7 are disposed at the end parts of each basic cell array 5, and a circuit of high driving power is manufactured using the special basic cells 8, so that the utilization factor of the basic cells is enhanced more than in a case where the circuit of high driving power is manufactured by connecting some of the basic cells in parallel.

(2) A clock buffer circuit C is manufactured using the special basic cells 8 disposed at the end part of the basic cell array 5, whereby a signal wiring line 16 (or 18) for connecting an I/O cell 3 with this clock buffer circuit C can be shortened. Thus, the impedance of the signal wiring line 16 (or 18) is lowered to stabilize an input signal level, so that the operating reliability of circuitry is enhanced.

(3) Those parts of an inter-layer insulator film 14 on the special basic cells 8 which extend beyond the width (l) of the basic cell array 5 are used as wiring channel regions 6, whereby the circuit of high driving power can be manufactured without lowering the utilization factor of the wiring channel regions 6 and without enhancing the cell size.

(4) Owing to the above items (1) and (3), the versatility of wiring design is enhanced, and a period of time for the development of a gate array can be shortened.

It is added that, in the illustration of FIGS. 7 and 8, a 3-input NAND circuit is formed using the basic cell 7A, while an inverter circuit is formed using the basic cell 7B.

Embodiment 2

Embodiment 2 is the second embodiment of the present invention according to which, in the semiconductor integrated circuit device of Embodiment 1, the gate electrodes of the complementary MOSFETs constituting the special basic cell 8 are formed into an interdigitated pattern.

Figure 9:
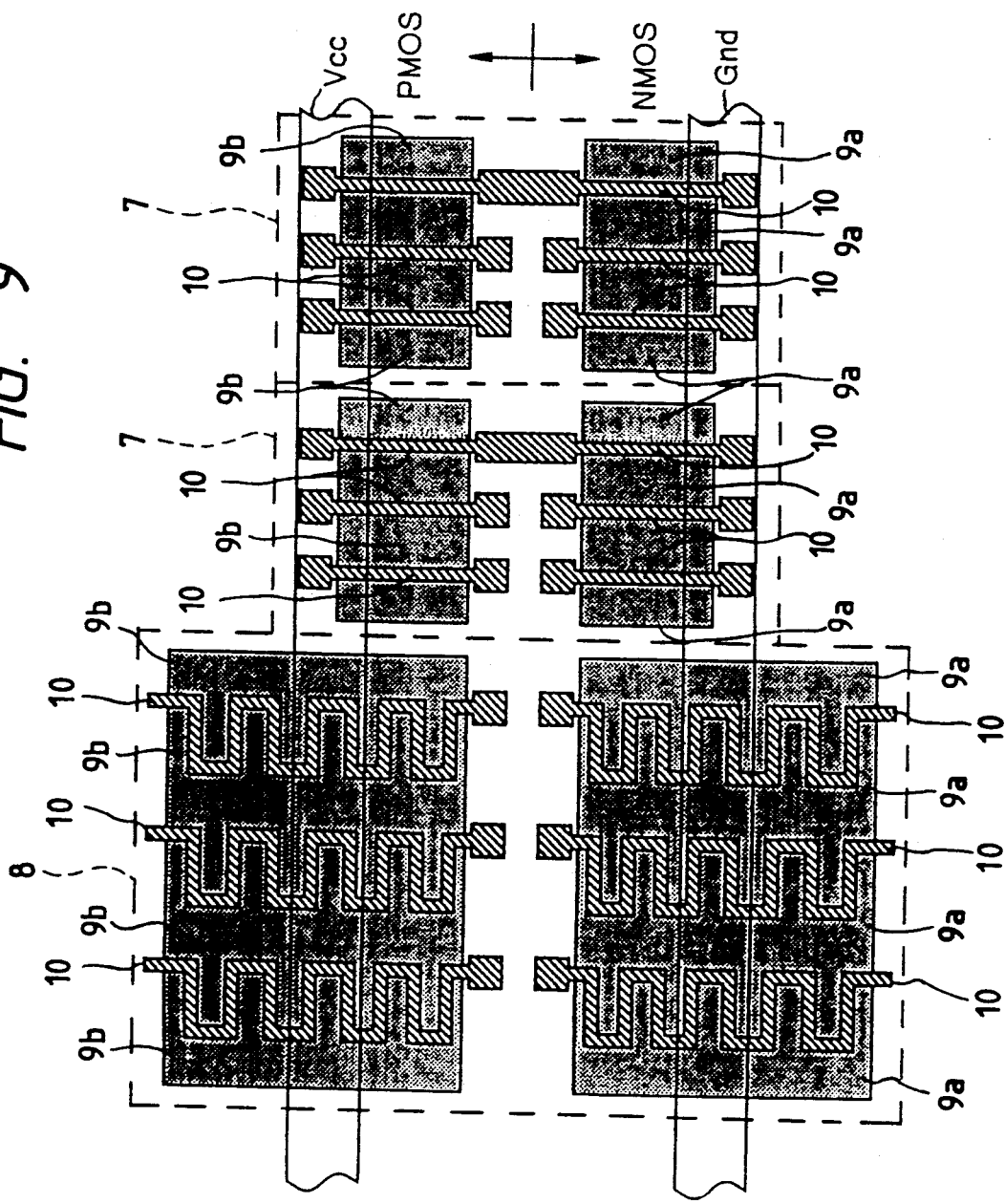
FIG. 9 is a pattern layout diagram of a special basic cell in another embodiment of the present invention.

FIG. 9 shows the special basic cell 8 of a complementary MOS gate array according to Embodiment 2. This special basic cell 8 is configured of, for example, three P-channel MOSFETs and three N-channel MOSFETs. As to these MOSFETs, semiconductor regions 9a, 9b and gate electrodes 10 are longer in the vertical direction of the figure than those of MOSFETs constituting basic cells 7, and each of the gate electrodes 10 is formed into the interdigitated pattern. Accordingly, the MOSFETs constituting the special basic cell 8 of Embodiment 2 have a gate width which is, in effect, greater than that of the MOSFETs constituting the special basic cell 8 of Embodiment 1. Therefore, they can form a circuit of higher driving power.

Figure 10:
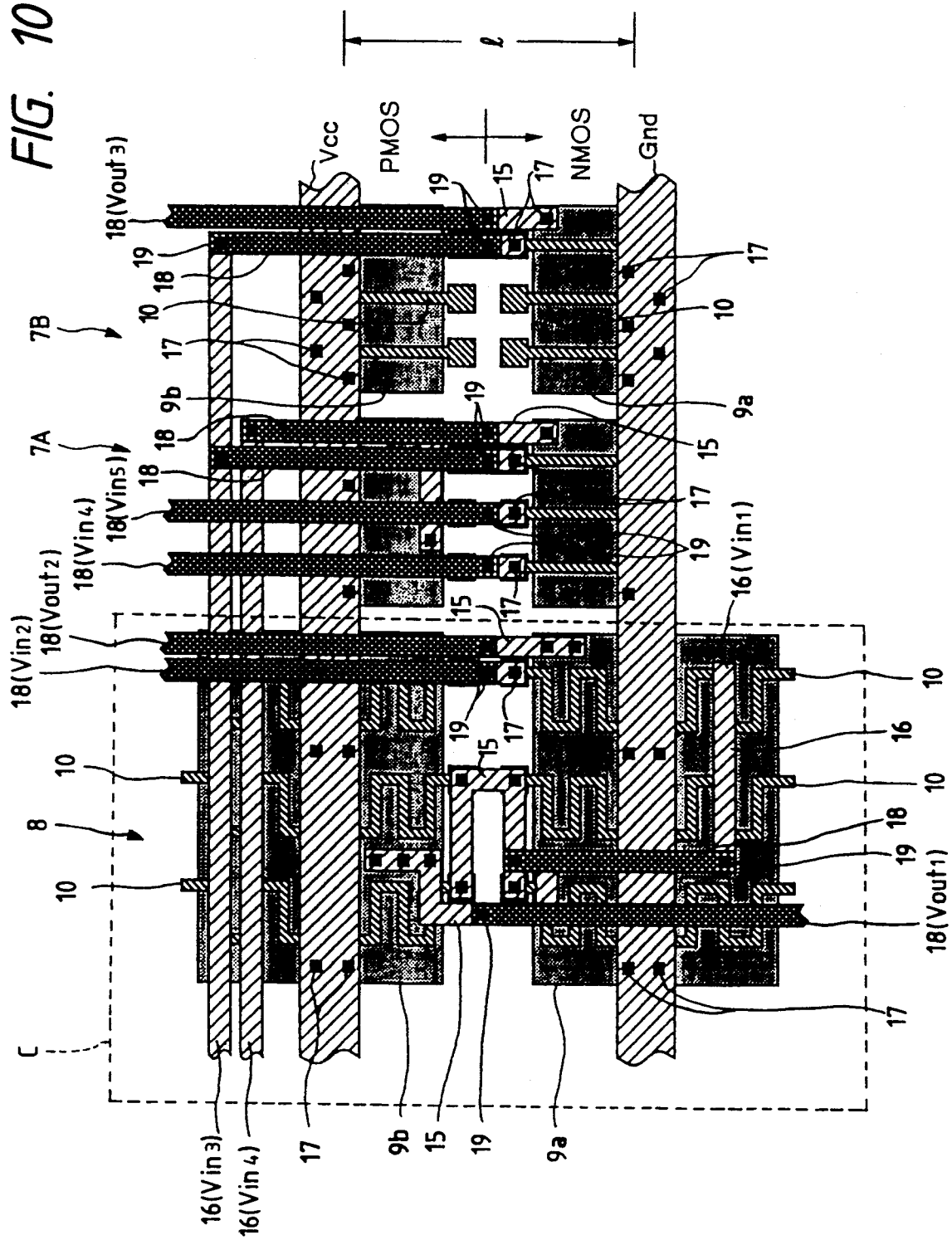
FIG. 10 is a block circuit diagram showing a clock buffer circuit which is formed using the special basic cell in FIG. 9.
Figure 11:
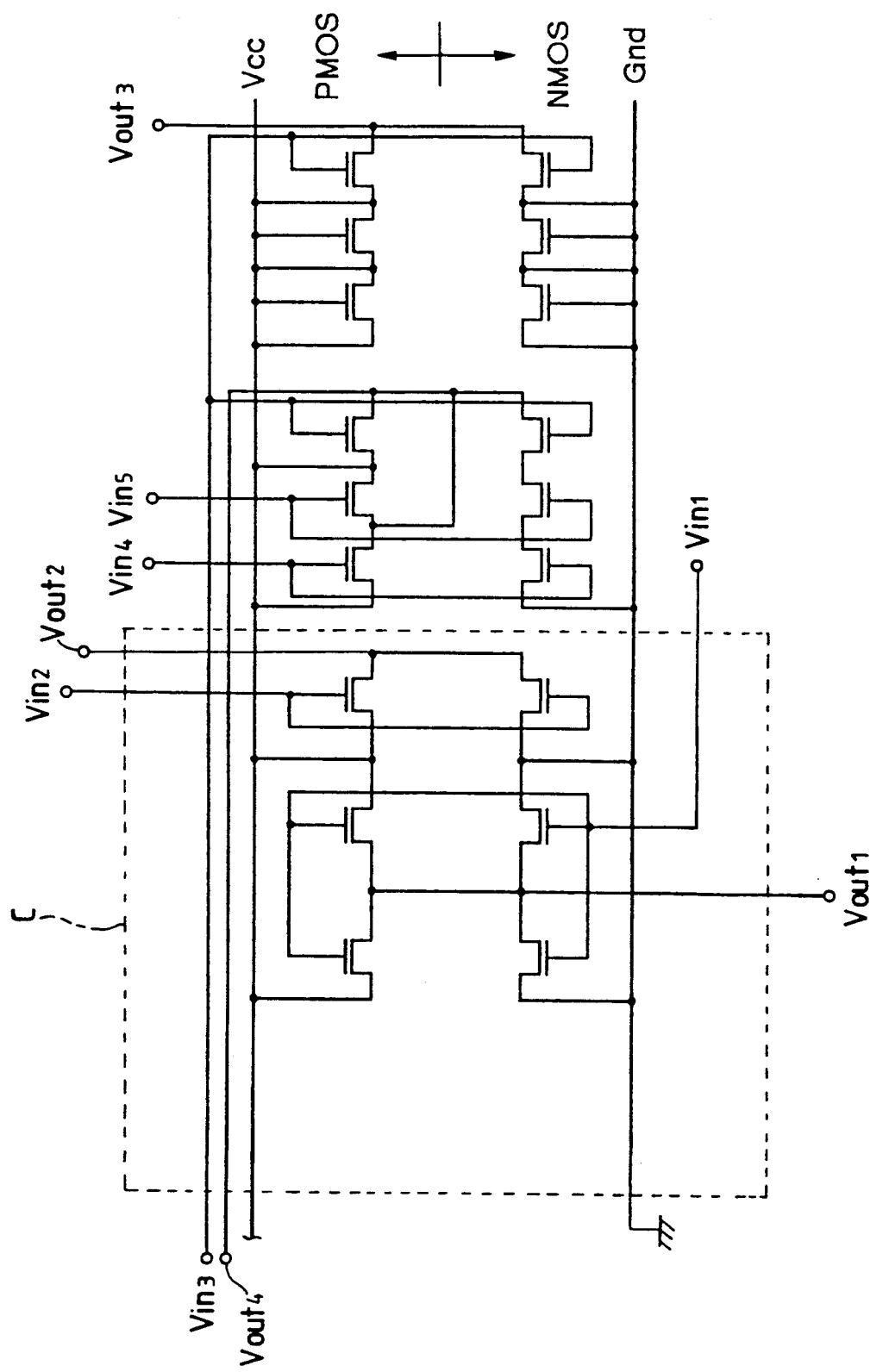
FIG. 11 is an equivalent circuit diagram to FIG. 10.

FIGS. 10 and 11 illustrate a clock buffer circuit C which is formed using the special basic cell 8. According to Embodiment 2, the clock buffer circuit C can be manufactured by the use of the single special basic cell 8.

The semiconductor integrated circuit device thus constructed can bring forth effects similar to those of Embodiment 1 listed before.

Embodiment 3

Embodiment 3 is the third embodiment of the present invention according to which, in the semiconductor integrated circuit device of Embodiment 2, a delay circuit is formed using the special basic cell.

Figure 12:
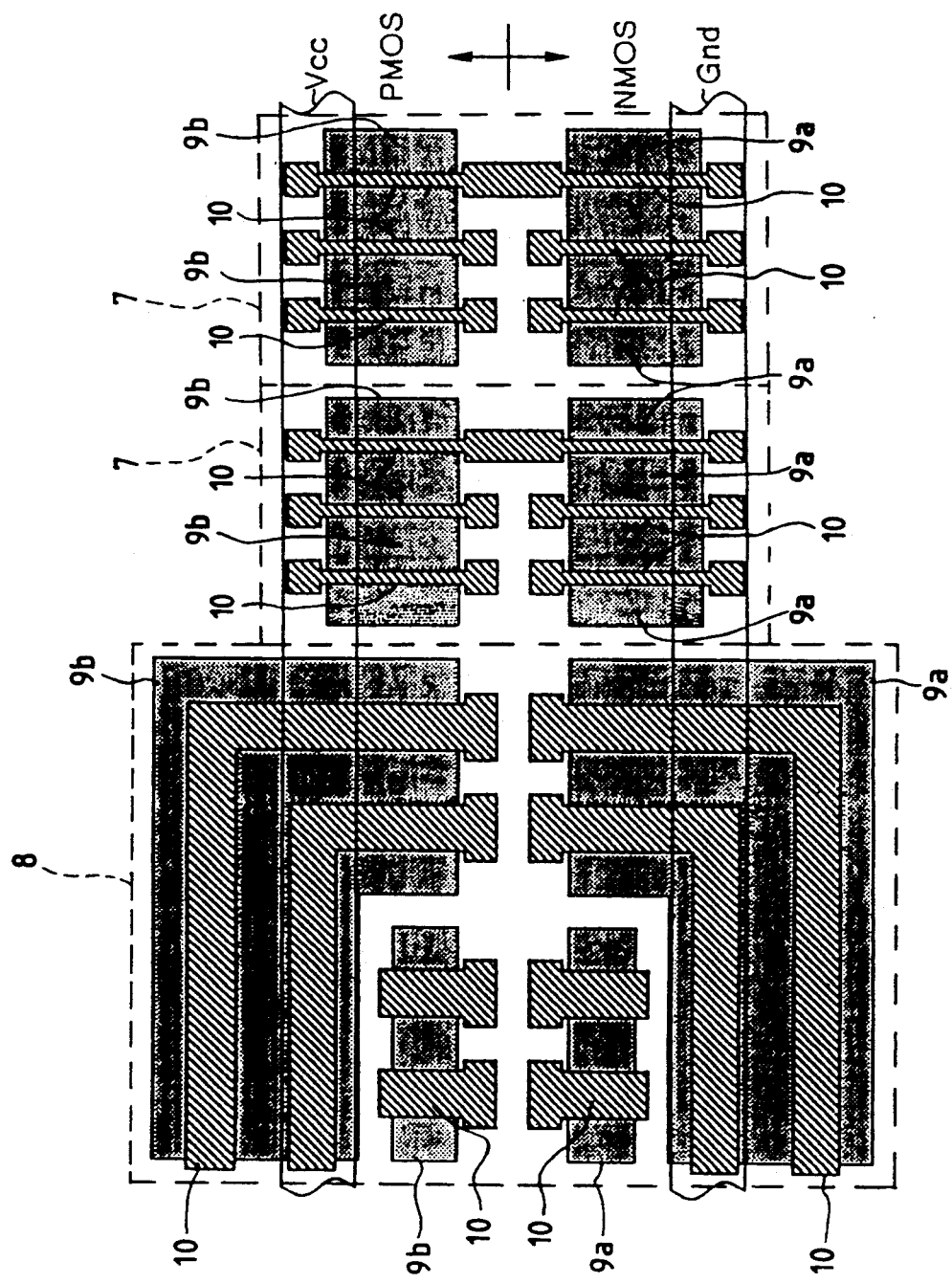
FIG. 12 is a pattern layout diagram of a special basic cell in another embodiment of the present invention.

FIG. 12 shows the special basic cell 8 of a complementary MOS gate array according to Embodiment 3. This special basic cell 8 is configured of, for example, four P-channel MOSFETs and four N-channel MOSFETs. The gate electrodes 10 of these MOSFETs are greater in the gate length than those of MOSFETs constituting basic cells 7. Among the MOSFETs of the special basic cell 8, two pchannel MOSFETs and two N-channel MOSFETs have semiconductor regions 9a, 9b and the gate electrodes 10, which are in the shape of a letter L. Accordingly, they are, in effect, greater in the gate width than the MOSFETs constituting the basic cells 7.

Figure 13:
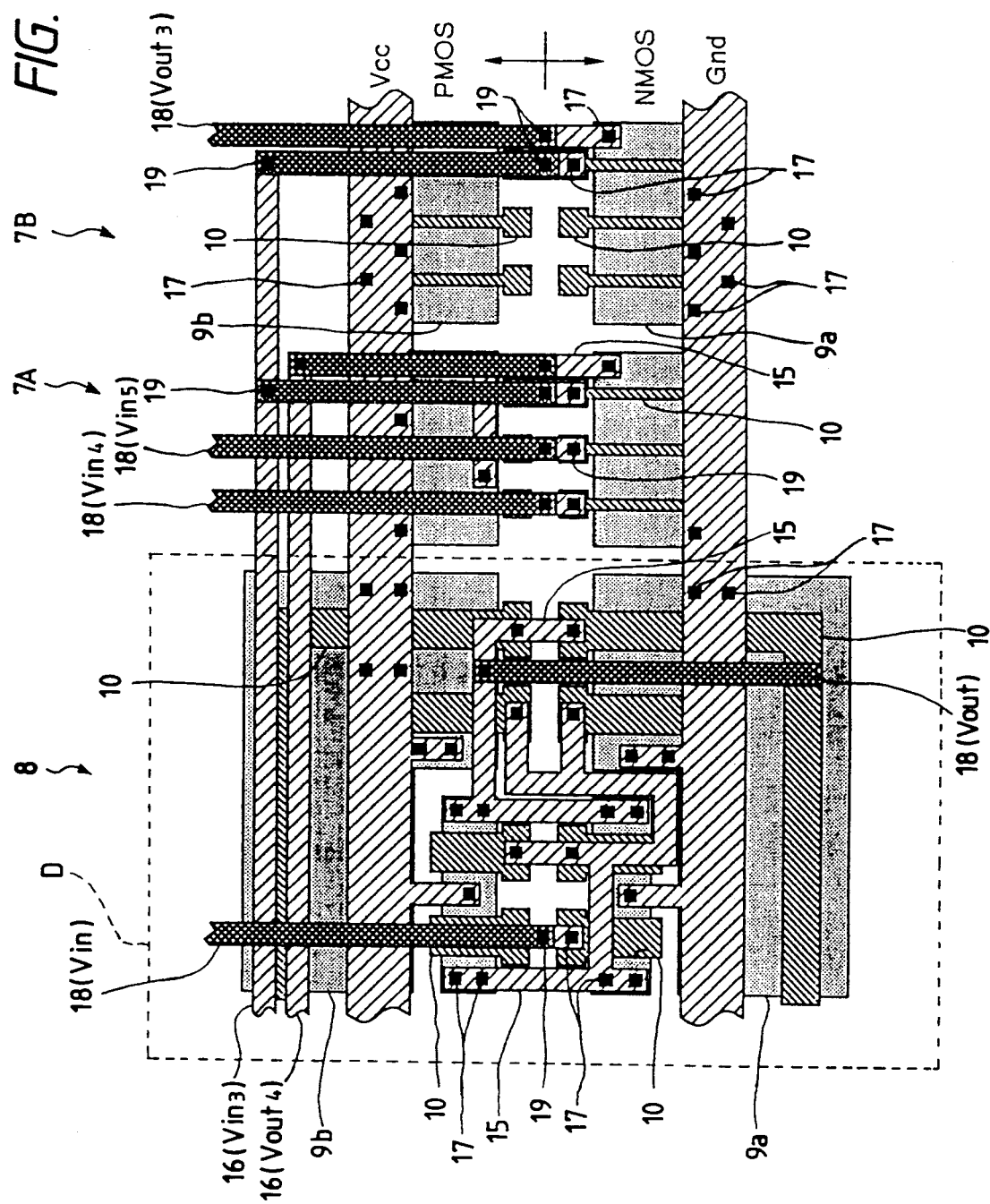
FIG. 13 is a block circuit diagram showing a delay circuit which is formed using the special basic cell in FIG. 12.
Figure 14:
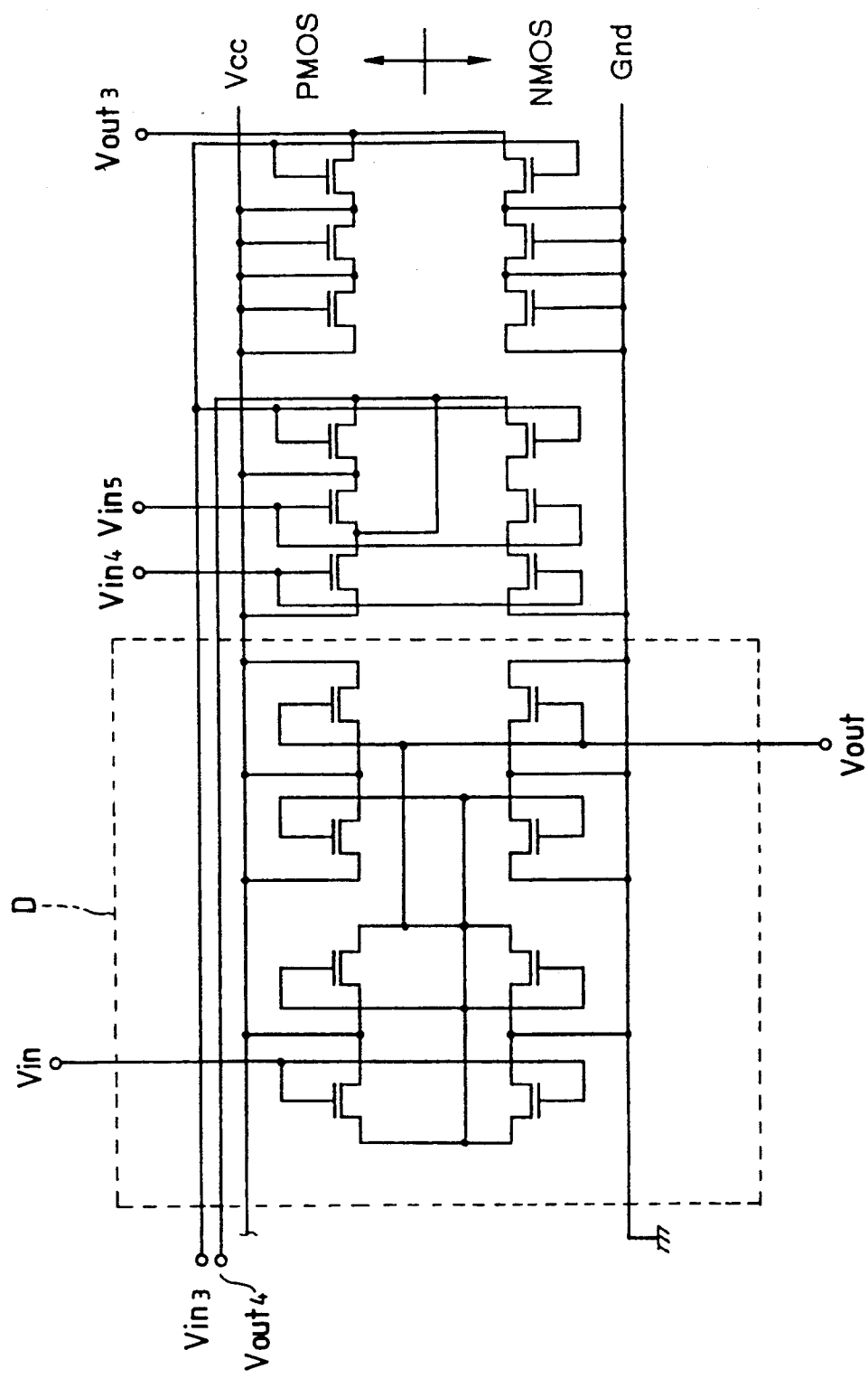
FIG. 14 is an equivalent circuit diagram corresponding to FIG. 13.
Figure 15:
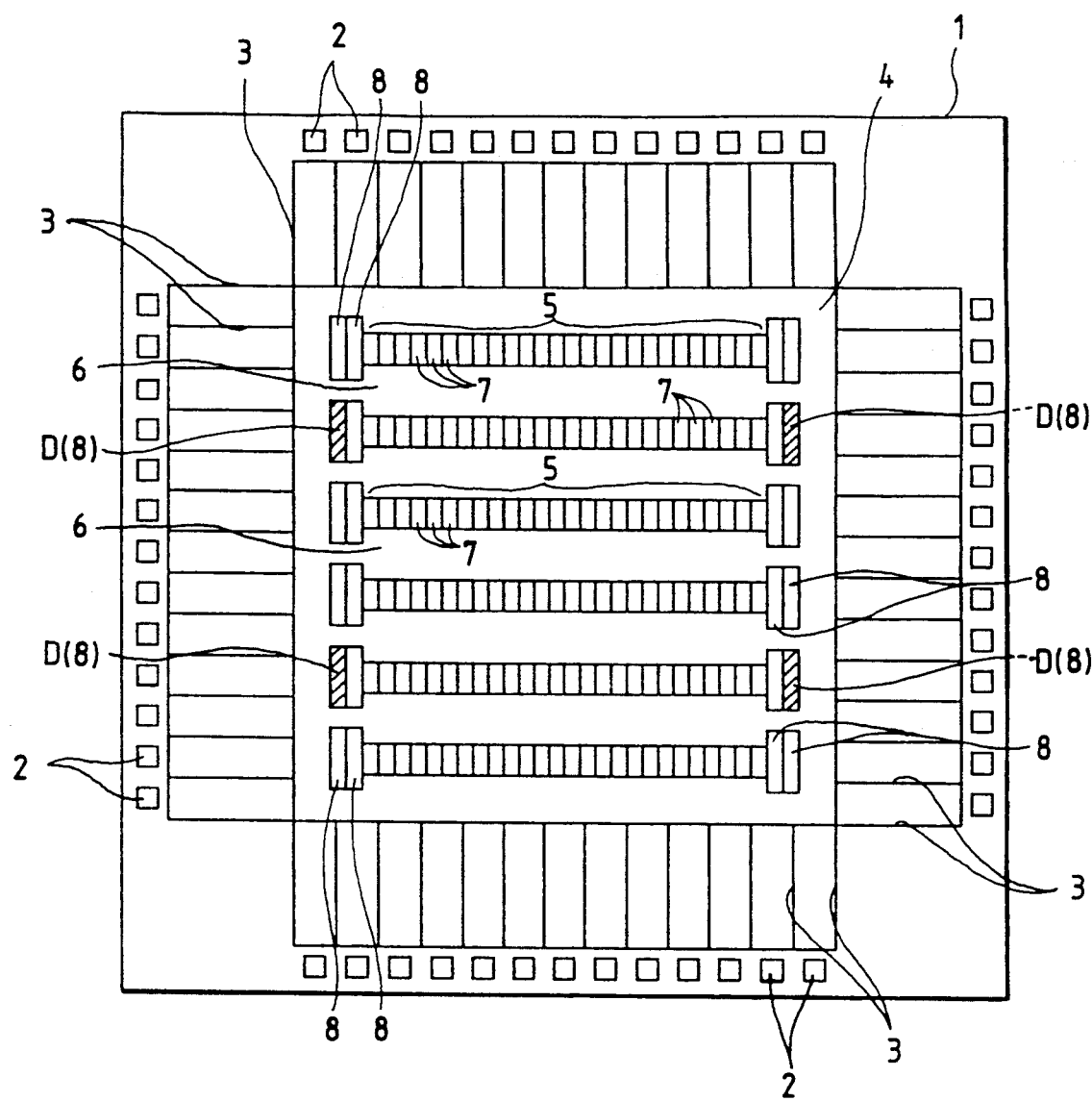
FIG. 15 is a plan view showing a cell layout in another embodiment of the present invention.

FIGS. 13 and 14 illustrate the delay circuit D which is manufactured using the special basic cell 8. Such delay circuits D are provided in the four places (hatched in FIG. 15) of an internal circuit region 4 as shown in FIG. 15.

Although, in the above, the invention made by the inventor has been concretely described in conjunction with embodiments, it is needless to say that the present invention is not restricted to the foregoing embodiments 1-3, but that it can be variously altered within a scope not departing from the purport thereof.

Figure 16:
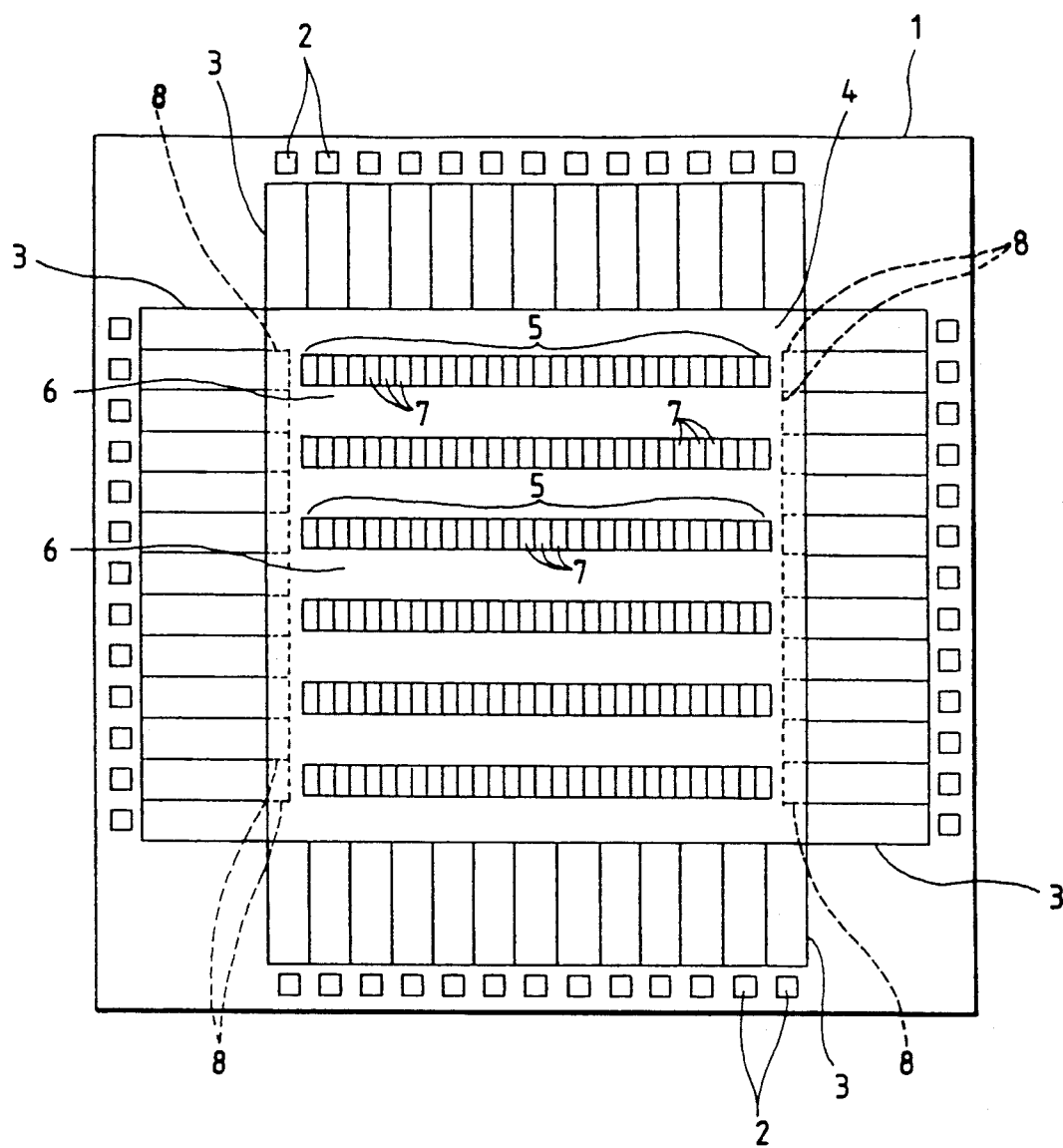
FIG. 16 is a plan view showing a cell layout in still another embodiment of the present invention.

The embodiments 1-3 have referred to the case where special basic cells are disposed so as to continue to ordinary basic cells, but this case is not restrictive. As shown in FIG. 16 by way of example, each special basic cell 8 may well be so disposed as to continue to an I/O cell 3 and be buried under an internal circuit region 4.

The embodiments 1-3 have referred to the case where a clock buffer circuit or a delay circuit is manufactured using one or more special basic cells, but this case is not restrictive. It is also possible to manufacture a different circuit, for example, a buffer circuit between blocks, which requires a driving power level higher than that of a general logic circuit. It is also allowed to manufacture an input buffer by the use of the special basic cell of the present invention, in a case where the input buffer has a large fan-out number.

Although, in the above, the invention made by the inventor has been chiefly described as to the case of application to a CMOS gate array forming the field of utilization thereof, the present invention is not restricted thereto, but is also applicable to an ECL (emitter-coupled logic) gate array and Bi-CMOS (bipolar-CMOS) gate array.

Effects which are achieved by typical aspects of performance of the present invention are briefly described as follows:

(1) In a semiconductor integrated circuit device of master slice scheme having an internal circuit region and peripheral circuits which surround the internal circuit region, the internal circuit region including wiring channel regions and basic cell arrays in each of which a plurality of basic cells are arranged in a matrix shape; special basic cells constructed of transistors which are larger in size than transistors constituting the basic cells are disposed at the end parts of each of the basic cell arrays, and a circuit of high driving power is manufactured using one or more of the special basic cells, so that the utilization factor of the basic cells is enhanced more than in the case where the circuit of high driving power is formed by connecting some of the basic cells in parallel.

(2) A clock buffer circuit is manufactured using one or more of the special basic cells disposed at the end part of the basic cell array, whereby signal wiring lines for connecting the peripheral circuit and the clock buffer circuit shorten. Thus, the input signal level of the signal wiring line is stabilized to enhance the operating reliability or circuitry.

(3) Those parts of the special basic cell which extend beyond the width lines of the basic cell array are buried under the wiring channel regions, whereby the circuit of high driving power can be manufactured without lowering the utilization factor of the wiring channel regions and without enhancing the chip size.

What is claimed is:

1. A semiconductor integrated circuit device comprising:

a semiconductor substrate having a principal surface which forms an internal circuit region and peripheral circuit regions;

a plurality rows of basic cell arrays which have basic cells of a MOSFET type forming a matrix array and which is formed on said internal circuit region, each row of basic cell array arranged along a first direction and said each row having a gate width which is measured along a second direction which is perpendicular to said first direction;

wiring channel formation regions which are located between adjacent rows of said basic cell arrays; and a special basic cell of a MOSFET type formed adjacent each end portion of said plurality of rows of said basic cell arrays, said special basic cell having a larger gate width which is measured along said second direction than said gate width of the basic cells of a respective array, wherein said special basic cell has a pair of end portions which extend along said first direction and which extend into a pair of adjacent wiring channel regions.

2. A semiconductor integrated circuit device according to claim 1, wherein said wiring channel formation regions being insulated from said basic cells by a layer of an insulator film.

3. A semiconductor integrated circuit device according to claim 1, wherein each said special basic cell is disposed so as to be contiguous with said basic cells of a respective basic cell array.

4. A semiconductor integrated circuit device according to claim 1, wherein said special basic cells are disposed so as to continue to peripheral circuits of said peripheral circuit regions and are buried under said internal circuit region through an insulator film.

5. A semiconductor integrated circuit device according to claim 1, wherein said special basic cells form a clock buffer circuit.

6. A semiconductor integrated circuit device according to claim 1, wherein said special basic cells form a delay circuit.

7. A semiconductor integrated circuit device according to claim 1, wherein each special basic cell is formed by transistors of complementary MOSFETs.

8. A semiconductor integrated circuit device according to claim 7, wherein a gate electrode of each of said complementary MOSFETs constituting said each special basic cell is formed in an interdigitated pattern.

9. A semiconductor integrated circuit device adopting a gate array scheme, wherein circuits constructed of basic cells, which are arranged in a matrix array, are connected by a plurality of layers of wiring, comprising:

a semiconductor substrate having a principal surface which forms an internal circuit region and peripheral circuit regions;

a plurality rows of basic cell arrays which have basic cells of a MOSFET type forming said matrix array and which is formed on said internal circuit region, each row of basic cell array arranged along a first direction and said each row having a gate width which is measured along a second direction which is perpendicular to said first direction;

wiring channel formation regions which are located between adjacent rows of said basic cell arrays; and a special basic cell of a MOSFET type formed adjacent each end portion of said plurality of rows of said basic cell arrays, said special basic cell having a higher driving power capability than that of said basic cells, and said special basic cells having a larger gate width which is measured along said second direction than said gate width of the basic cells of a respective array, wherein said special basic cell has a pair of end portions which extend along said first direction and which extend into a pair of adjacent wiring channel regions.

10. A semiconductor integrated circuit device according to claim 9, wherein each special basic cell is formed by transistors of complementary MOSFETs.

11. A semiconductor integrated circuit device according to claim 10, wherein a gate electrode of each of said complementary MOSFETs constituting said each special basic cell is formed in an interdigitated pattern.

12. A semiconductor integrated circuit device according to claim 10, wherein said wiring channel formation regions being insulated from said basic cells by a layer of an insulator film.

13. A semiconductor integrated circuit device according to claim 1, wherein the MOSFETs of said special basic cells have a greater gate width to gate length ratio than that of MOSFETs of said basic cells, the gate length being measured in said first direction.

14. A semiconductor integrated circuit device according to claim 2, wherein gate electrodes of MOSFETs of said special basic cells extend substantially in the same direction as that of MOSFETs of said basic cells.

15. A semiconductor integrated circuit device according to claim 10, wherein the MOSFETs of said special basic cells have a greater gate width to gate length ratio than that of MOSFETs of said basic cells, the gate length being measured in said first direction.

16. A semiconductor integrated circuit device according to claim 12, wherein gate electrodes of the MOSFETs of said special basic cells extend substantially in the same direction as that of MOSFETs of said basic cells.

* * * * *